(12) United States Patent
Park (10) Patent No.: US 9,674,937 B2
(45) Date of Patent: Jun. 6, 2017

(54) CIRCUIT BOARD AND METHOD OF MANUFACTURING THE SAME

(71) Applicant: Samsung Electro-Mechanics Co., Ltd., Suwon-si (KR)

(72) Inventor: Jung-Hyun Park, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/001,557

(22) Filed: Jan. 20, 2016

(65) Prior Publication Data

US 2016/0381781 A1    Dec. 29, 2016

(30) Foreign Application Priority Data

Jun. 25, 2015    (KR) .................. 10-2015-0090655

(51) Int. Cl.
| | |
|---|---|
| *H05K 1/00* | (2006.01) |
| *H05K 1/02* | (2006.01) |
| *H05K 1/11* | (2006.01) |
| *H05K 3/46* | (2006.01) |
| *H05K 3/42* | (2006.01) |

(52) U.S. Cl.
CPC ......... *H05K 1/0203* (2013.01); *H05K 1/0298* (2013.01); *H05K 1/115* (2013.01); *H05K 3/42* (2013.01); *H05K 3/4644* (2013.01)

(58) Field of Classification Search
CPC ... H05K 1/02; H05K 1/03; H05K 1/11; H05K 3/00; H05K 3/18; H05K 3/30; H05K 3/46; H01L 21/00; H01L 21/02; H01L 21/48; H01L 21/50; H01L 21/56; H01L 23/14; H01L 23/28; H01L 23/31; H01L 23/48; H01L 23/52
USPC ............... 174/252, 251, 255, 258, 262, 377; 257/252, 690, 698, 712, 717; 361/709, 361/761

See application file for complete search history.

(56) References Cited

U.S. PATENT DOCUMENTS

| | | | | |
|---|---|---|---|---|
| 5,480,048 A * | 1/1996 | Kitamura | ............ | H01L 21/4857 216/13 |
| 5,841,190 A * | 11/1998 | Noda | .................. | H01L 23/3107 257/668 |
| 6,254,971 B1 * | 7/2001 | Katayose | ............... | H01L 23/142 174/258 |
| 6,828,510 B1 * | 12/2004 | Asai | ........................ | H05K 3/387 174/255 |
| 2004/0041243 A1 * | 3/2004 | Ogawa | ................ | H01L 23/3121 257/668 |
| 2004/0148766 A1 * | 8/2004 | Noguchi | .............. | H05K 3/4655 29/830 |

(Continued)

*Primary Examiner* — Xiaoliang Chen
(74) *Attorney, Agent, or Firm* — NSIP Law (57) ABSTRACT

A circuit board including a core layer having a first surface and a second surface opposite to the first surface; a first build-up layer and a second build-up layer formed on the first surface and the second surface of the core layer, respectively, and including a conductive pattern and a conductive via; and an outer layer formed on the surface of the first build-up layer and the second build-up layer, wherein at least one build-up layer of the first build-up layer and the second build-up layer comprises a photosensitive insulating layer in which a cavity is disposed and a thermal dissipation unit disposed in the cavity.

11 Claims, 7 Drawing Sheets

(56) References Cited

U.S. PATENT DOCUMENTS

| | | | | |
|---|---|---|---|---|
| 2005/0068748 | A1* | 3/2005 | Ogawa | H01L 23/3121 361/748 |
| 2006/0145328 | A1* | 7/2006 | Hsu | H01L 23/5389 257/690 |
| 2006/0244128 | A1* | 11/2006 | Hayashi | H01L 21/4853 257/712 |
| 2007/0045815 | A1* | 3/2007 | Urashima | H05K 1/0231 257/698 |
| 2008/0237828 | A1* | 10/2008 | Yang | H01L 21/6835 257/690 |
| 2008/0290507 | A1* | 11/2008 | Park | H05K 1/186 257/717 |
| 2009/0301766 | A1* | 12/2009 | Park | H01L 23/3121 174/255 |
| 2010/0072588 | A1* | 3/2010 | Yang | H01L 23/49816 257/676 |
| 2010/0078655 | A1* | 4/2010 | Yang | H01L 23/49816 257/81 |
| 2010/0288535 | A1* | 11/2010 | Hong | H01L 23/5389 174/252 |
| 2011/0242765 | A1* | 10/2011 | Lin | H01L 23/3677 361/709 |
| 2011/0256714 | A1* | 10/2011 | Yang | H01L 23/49816 438/652 |
| 2014/0048326 | A1* | 2/2014 | Lin | H05K 9/00 174/377 |
| 2015/0055309 | A1* | 2/2015 | Bae | H01L 23/481 361/761 |
| 2015/0257261 | A1* | 9/2015 | Kitagawa | H05K 1/0298 361/688 |
| 2015/0257268 | A1* | 9/2015 | Kitagawa | H05K 3/007 174/262 |
| 2015/0319842 | A1* | 11/2015 | Asano | H05K 3/0026 361/707 |
| 2015/0366102 | A1* | 12/2015 | Ishihara | H05K 3/429 361/711 |
| 2016/0227641 | A1* | 8/2016 | Ku | H05K 1/0206 |

* cited by examiner

CIRCUIT BOARD AND METHOD OF MANUFACTURING THE SAME

CROSS REFERENCE TO RELATED APPLICATION(S)

This application claims the benefit under 35 USC 119(a) of Korean Patent Application No. 10-2015-0090655 filed on Jun. 25, 2015 in the Korean Intellectual Property Office, the entire disclosure of which is incorporated herein by for all purposes.

BACKGROUND

1. Field

The following description relates to a circuit board.

2. Description of Related Art

A circuit board can be used for various types of electro component package applications such as a system in package (SiP) enclosing a number of chips or a module package. The circuit board for electro component package applications is needed to have high thermal dissipation to effectively release heat generated from electro components since such thermal dissipation properties greatly affect reliability operations and qualities of electro component packages.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a circuit board includes a core layer including a first surface and a second surface opposite to the first surface; a first build-up layer and a second build-up layer formed on the first surface and the second surface of the core layer, respectively, and including a conductive pattern and a conductive via; and an outer layer formed on each surface of the first build-up layer and the second build-up layer, wherein at least one build-up layer of the first build-up layer and the second build-up layer includes a photosensitive insulating layer in which a cavity is formed and a thermal dissipation unit formed by filling the cavity with a conductive material.

According to another general aspect, a method for manufacturing a circuit board includes: preparing a core layer including a first surface and a second surface opposite to the first surface; forming at least one first build-up layer and at least one second build-up layer on the first surface and the second surface of the core layer, respectively; and forming an outer layer on the surface of the first build-up layer and the second build-up layer, wherein the forming at least one of the first build-up layer and the second build-up layer includes: forming a photosensitive insulating layer; forming a hole and a cavity in the photosensitive insulating layer using exposure and developing process; forming a conductive via and a thermal dissipation unit by filling the hole and cavity with a conductive material; and forming a conductive pattern on the surface of the photosensitive insulating layer.

A circuit board having improved thermal dissipation properties and a method of manufacturing the same are described below. Excellent thermal dissipation properties of the circuit board according to an example may be ensured by providing a thermal dissipation unit using a photosensitive insulating material.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Circuit boards according to some examples described herein may be applied in various electronic devices, for example, a mobile phone, a personal digital assistant, a digital video camera, a digital still camera, a network system, a computer, a monitor, a television, a video game, a smart watch, and various other electronic devices well known to one of ordinary skill in the art.

Figure 1:
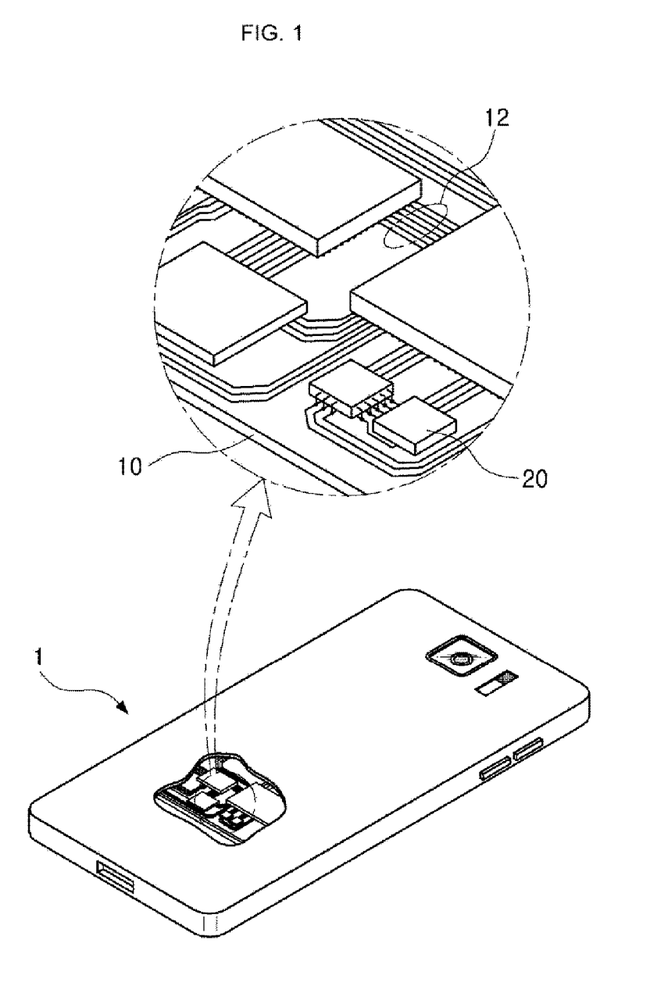
FIG. 1 is a perspective view illustrating an electronic device in which an example of a circuit board is applied.

Referring to FIG. 1, a circuit board according to an example is used as a main circuit board 10 to install or embed various electronic components 20 in an electronic device 1. The circuit board may be also used as a base board (not shown) of the electronic components 20 such as a semiconductor package which has a smaller size. Furthermore, it may be applied in various forms to other electronic devices in addition to mobile devices.

Figure 2:
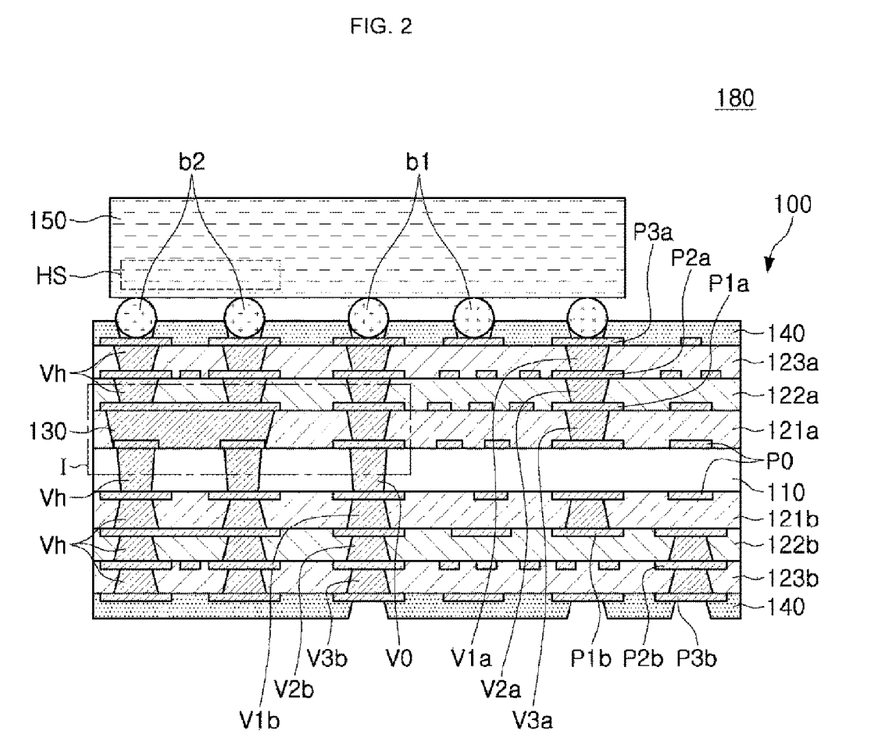
FIG. 2 is a sectional view illustrating a semiconductor package in which an example of a circuit board is applied.

Referring to FIG. 2, a semiconductor package 180 includes a circuit board 100 and an electronic component 150 mounted on the circuit board 100. The electronic component 150 may be a semiconductor chip, for example an application processor chip. The circuit board 100 includes a board laminate comprising a core layer 110 and three first build-up layers 121a, 122a, 123a and three second build-up layers 121b, 122b, 123b which are formed on the upper surface and the lower surface of the core layer 110, respectively. In this description, the core layer 110, the first build-up layers 121a, 122a, 123a, and the second build-up layers 121b, 122b, 123b in the circuit board 100 form the board laminate.

The core layer 110 includes an inner layer circuit including a conductive pattern P0 formed on the upper surface and the lower surface of the core layer 110 and conductive via V0 passing through the upper surface and the lower surface. The core layer 110 may be formed of a material having high rigidity to prevent warpage of the circuit board 100. For example, the core layer 110 may be an insulating resin containing a reinforcing agent such as a prepreg, a glass or a metal (e.g., Invar).

The first build-up layers 121a, 122a, 123a and the second build-up layers 121b, 122b, 123b may be formed in order on the upper surface and the lower surface of the core layer 110, respectively.

Outer layer circuits of the first build-up layers 121a, 122a, 123a include conductive patterns P1a, P2a, P3a and conductive vias V1a, V2a, V3a formed on each level. Outer layer circuits of the second build-up layers 121b, 122b, 123b may include conductive patterns P1b, P2b, P3b and conductive vias V1b, V2b, V3b.

The first build-up layers 121a, 122a, 123a and the second build-up layers 121b, 122b, 123b may be formed of a photosensitive insulating material. The conductive vias V1a, V2a, V3a, V1b, V2b, V3b are formed by forming holes through coating with the photosensitive insulating material and selective exposure and developing process and filling the holes with a conductive material (e.g., plating).

The first build-up layer 121a which is in contact with the core layer 110 includes a cavity C. A thermal dissipation unit 130 which is formed of a conductive material is disposed in the cavity C. Thermal dissipation unit 130 may be formed by filling the inner space of the cavity C with a conductive material.

The thermal dissipation unit 130 is disposed near an electronic component 150 that generates heat. As shown in FIG. 2, thermal dissipation unit 130 is disposed in a region corresponding to a hot spot region HS where excess heat is generated by the electronic component 150.

The circuit board 110 includes heat dissipation vias Vh which are formed in the core layer 110 and each of the other build-up layers 122a, 123a, 121b, 122b, 123b. The heat dissipation via Vh may be directly or indirectly connected with thermal dissipation unit 130 to be further connected with the upper surface and the lower surface of the circuit board 100. Thus, the thermal dissipation unit 130 is provided with a heat dissipation path through the heat dissipation vias Vh in a vertical direction of the circuit board 100. Here, indirect connection between the heat dissipation via Vh and the thermal dissipation unit 130 may mean that it is connected through other heat dissipation vias Vh.

In this example, the thermal dissipation unit 130 is mounted only in the build-up layer 121a. However, it may be mounted in other build-up layers without any limitation (see FIG. 6 to FIG. 8).

The cavity C may be formed through exposure and developing process which is similar to the process for forming the holes. The thermal dissipation unit 130 may be formed through a filling process with a conductive material. The process for forming the cavity C and the thermal dissipation unit 130 is performed easily by being combined with other processes. The process for forming the cavity C may be performed together with the process for forming the conductive via V1a of the first build-up layer 121a. The process for forming the thermal dissipation unit 130 may be performed together with the process for forming the conductive via V1a of the first build-up layer 121a by filling a conductive material (see FIG. 5A to FIG. 5D).

The thermal dissipation unit 130 is a conductive material with excellent thermal conductivity such as Cu. The conductive material of the thermal dissipation unit 130 is a conductive material which is the same as the conductive via V1a. For example, the conductive via V1a may be Cu, Al, Ag, Au, Ni, Pd or a combination thereof. The conductive vias V2a, V3a, V1b, V2b, V3b of the other build-up layer may be also formed with the same or similar conductive material. The conductive patterns P1a, P2a, P3a, P1b, P2b, P3b may be formed together with the process of forming the conductive vias V1a, V2a, V3a, V1b, V2b, V3b by filling a conductive material. However, the conductive patterns P1a, P2a, P3a, P1b, P2b, P3b may be also formed by applying a metal foil such as a copper foil on the surface of the build-up layer and then performing a patterning process.

A photosensitive insulating material suitable for the build-up layer includes a photosensitive composition and an insulating resin. For example, the photosensitive composition may include a photosensitive monomer and a photoinitiator. The photosensitive composition is a composition which responds to UV light.

For example, the insulating resin may be a thermosetting resin such as an epoxy resin or a thermoplastic resin such as polyimide.

In this example, all of the first build-up layers and the second build-up layers 121a, 122a, 123a, 121 b, 122b, 123b are formed of a photosensitive insulating material. However, the build-up layer 121a formed on the cavity or a part of the build-up layers may be formed of a photosensitive insulating material and the rest may be formed of an insulating resin which does not contain the photosensitive composition.

The circuit board 100 includes an outer layer 140. The outer layer 140 is formed on the surface of the board laminate. Particularly, the outer layer 140 is formed on the surface of the first build-up layer 123a and the second build-up layer 123b positioned at the outside surfaces of the board laminate. The outer layer 140 may be also a solder resist layer. The outer layer 140 includes a plurality of opening parts o to expose the conductive patterns P3a, P3b, which are formed on the first build-up layer 123a and the second build-up layer 123b, respectively, and electrically connect the electronic component 150 to the circuit board 100.

The electronic component 150 is electrically connected with a circuit of the circuit board 100 through a solder ball b1 for signal transmission. A thermal dissipation solder ball b2 connects the electronic component 150 to the heat dissipation via Vh and the thermal dissipation unit 130 so that the heat generated from the electronic component 150 is effectively released. In this example, the thermal dissipation solder ball b2 may also function as a bump for signal transmission according to an inner circuit structure.

Figure 3:
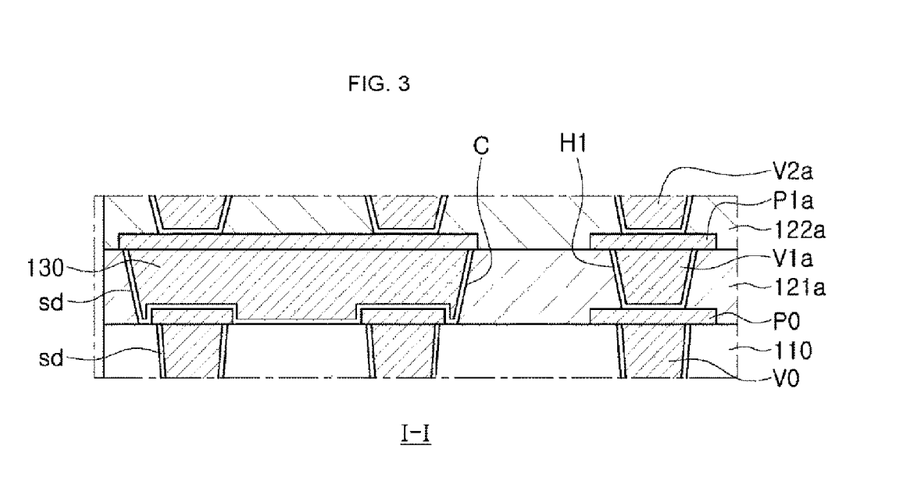
FIG. 3 is an enlarged view illustrating a part of the circuit board around a thermal dissipation unit illustrated in FIG. 2.

FIG. 3 is an enlarged view illustrating a part of the circuit board (the part around thermal dissipation unit) illustrated in FIG. 2.

The process for filling the thermal dissipation unit 130 and the via V1a may be a plating process such as electro plating.

Referring to FIG. 3, the thermal dissipation unit 130 includes a metal seed layer sd on the inner surface, which forms the ground, or bottom, surface and the side wall, of the cavity C. The metal seed layer sd is used as a seed to form a plating material for the thermal dissipation unit 130. The thermal dissipation unit 130 is formed with the plating material using the metal seed layer sd. For example, the metal seed layer sd may include Cu, Au, Ni, Pd, In, Ti, Sn or any combination thereof.

The metal seed layer sd is also formed on the inner surface of a hole H1 of the build-up layer 121a which is at the same level. Similarly, the metal seed layer sd is also formed on the inner surface on which conductive vias V0, V2a of the build-up layer 122a, which are at a different level, are to be formed.

FIG. 4A to FIG. 4F are sectional views of each step illustrating an example of a method for manufacturing the circuit board illustrated in FIG. 2.

Figure 4A:
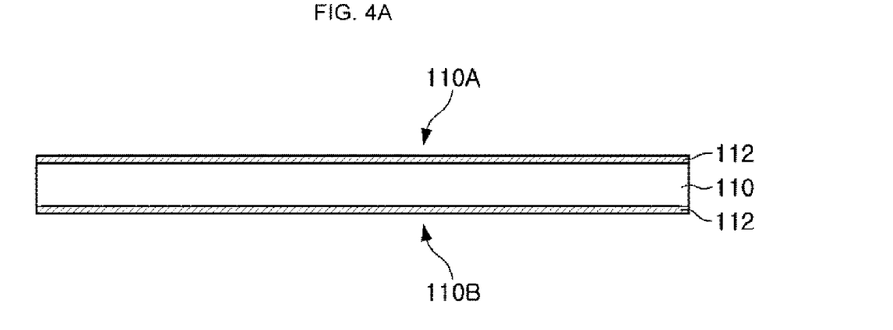
FIG. 4A to FIG. 4F are sectional views of each step illustrating an example of a method for manufacturing the circuit board illustrated in FIG. 2.

As shown in FIG. 4A, a core layer 110 including a first surface 110A and a second surface 110B are prepared. The core layer 110 may be a copper-clad laminate (CCL) in which a copper foil 112 is disposed on the first surface 110A and the second surface 110B.

The core layer 110 is an insulating resin containing a reinforcing agent such as a prepreg. The reinforcing agent may be a glass fiber or a metallic material and the insulating resin may be a bismaleimide triazine resin or an epoxy resin. The core layer 110 may be a glass or a metal (e.g., Invar). However, the core layer 110 is not be limited thereto. When the core layer 110 is a conductive material such as a metal, the surface where a circuit is to be formed is coated with an insulating material.

Figure 4B:
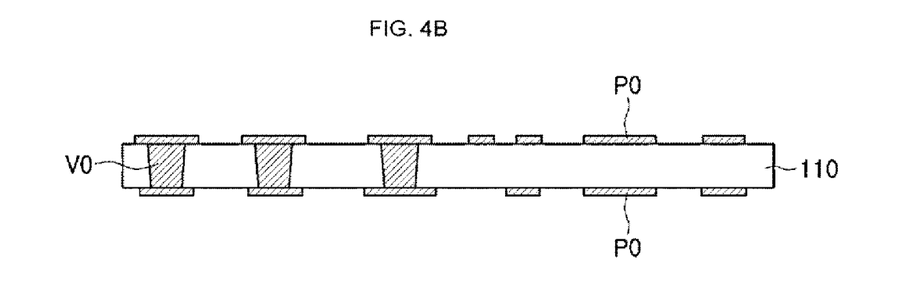

As shown in FIG. 4B, an inner layer circuit including a conductive via V0 and a conductive pattern P0 on the core layer 110 are formed. In this process, the conductive via V0 passing through the first surface 110A and the second surface 110B is formed. Particularly, the conductive via V0 may be formed by forming a hole through the core layer 110 and then performing a plating process to the inside the hole. The through hole may be formed using a mechanical drill and/or a laser drill. Here, the laser drill may be a $CO_2$ laser or a yttrium aluminum garnet (YAG) laser. However, the laser drill may not be limited thereto.

The conductive pattern P0 is formed on the first surface 110A and the second surface 110B. The conductive pattern P0 is formed by selectively eliminating the copper foil 112 using an etching resist pattern. The conductive pattern P0 formed on surfaces 110A, 110B is electrically connected to the conductive via V0. A part of the conductive via is connected with the thermal dissipation unit in the following process to act as a heat dissipation via.

Figure 4C:
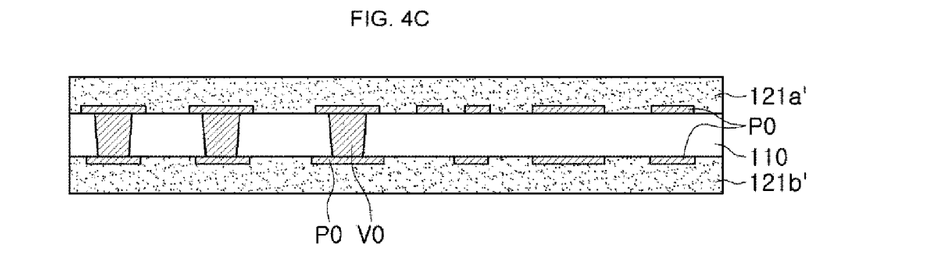

As shown in FIG. 4C, photosensitive insulating layers 121a', 121b' are disposed on the first surface 110A and the second surface 110B of the core layer 110 to serve as the first build-up layer and the second build-up layer.

The photosensitive insulating layer 121a', 121b' is formed of a photosensitive insulating resin including a photosensitive composition and an insulating resin. For example, the photosensitive composition may include a photosensitive monomer and a photoinitiator. The photosensitive composition may be a material which responds to the UV light. The insulating resin may be a thermosetting resin such as an epoxy resin or a thermoplastic resin such as polyimide. In one example, the photosensitive monomer may be an acrylate resin and the insulating resin may be a composite epoxy resin including a naphthalene-type epoxy resin and a rubber modified epoxy resin.

The photosensitive insulating resin further includes a hardening agent and a hardening accelerator. For example, the hardening agent may be phenol novolac, bisphenol novolac or a mixture thereof. The hardening accelerator may be an imidazole-based compound, for example, 2-methyl-imidazole, 1-(2-cyanoethyl)-2-alkylimidazole or a mixture thereof. The photosensitive insulating material may further include an inorganic filler if needed. For example, the inorganic filler may be graphite, carbon black, silica, clay or a combination thereof.

The photosensitive insulating layer 121a', 121b' may be formed by various processes. For example, the photosensitive insulating layer 121a', 121b' may be formed by compressing a film using a laminator on the both surfaces of the core layer 110 after forming an unhardened (or semi-hardened) film formed of a photosensitive insulating resin.

A cavity and a hole may be formed on the photosensitive insulating layer 121a', 121b by applying an expose and developing process, or photolithography process, using a mask. The holes for the cavity and the via may be easily formed by using the photosensitive insulating resin, instead of a conventional mechanical process using punching or blade.

Figure 4D:
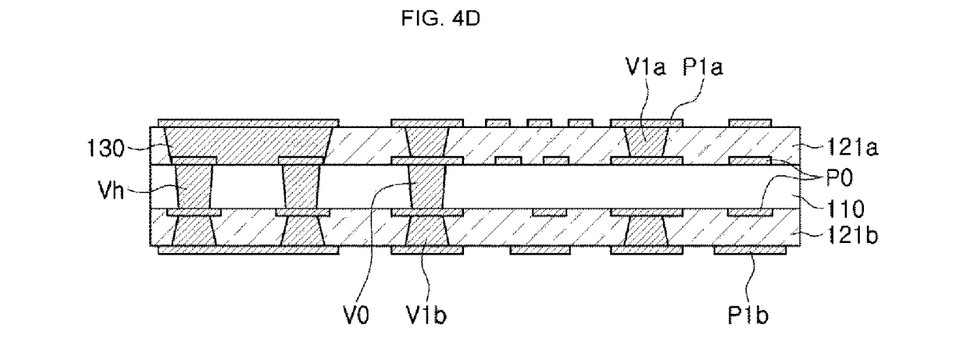

As shown in FIG. 4D, a thermal dissipation unit 130 and a conductive via V1a, V1b are formed by filling the cavity and the hole with a conductive material. Conductive patterns P1a, P1b are disposed on the surface of the first build-up layer and the second build-up layer 121a, 121b. In this process, the first build-up layer 121a and the second build-up layer 121b are formed by hardening the photosensitive insulating layers 121a', 121b' after the expose and developing process for forming the cavity and the hole. Thus, the cavity for the thermal dissipation unit 130 and the hole for the conductive via V1a may be formed at the same time. The filling process of the thermal dissipation unit 130 may be performed together with the filling process of the conductive via V1a, V1b. Thus, a conductive material of the thermal dissipation unit 130 may be the same as that of the conductive via V1a. The filling process may be performed using electro plating, electroless plating, screen printing, sputtering, evaporation, ink jetting, or dispensing process. Accordingly, the forming process of the thermal dissipation unit 130 is performed easily together with the forming process of the conductive via V1a of the build-up layer 121a at the same level.

The conductive patterns P1a, P1b may be formed through various processes. The conductive patterns P1a, P1b may be formed by a deposition process using a dry film pattern. Examples of the deposition process include a chemical vapor deposition (CVD), a physical vapor deposition (PVD) such as sputtering, a subtractive process, an additive process using electroless copper plating or copper electroplating, a semi-additive process (SAP) and a modified semi-additive process (MSAP). However, the deposition process is not be limited thereto. The conductive patterns P1a, P1b may be also formed by disposing a copper foil on the surface of the first build-up layer 121a and the second build-up layer 121b and then selectively removing the copper foil using an etching resist pattern.

Figure 4E:
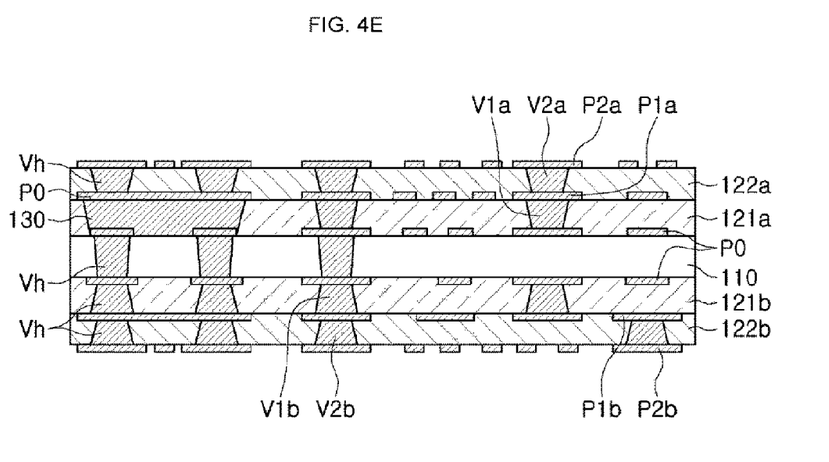

As shown in FIG. 4E, a first build-up layer 122a and a second build-up layer 122b including conductive vias Va2, Vb2 and conductive patterns Pa2, Pb2, respectively, may be further formed. The first build-up layer 122a and the second build-up layer 122b may be also formed of a photosensitive insulating resin. However, the build-up layer in which a thermal dissipation unit 130 is not formed may be formed of a typical insulating resin. For example, the insulating material may be a thermosetting resin such as an epoxy resin or a thermoplastic resin such as polyimide. The conductive vias Va2, Vb2 and the conductive patterns Pa2, Pb2 may be formed through the similar process which is used for forming vias and patterns of the build-up layer in other levels. A conductive via Vh is formed in the area which is overlapped with a thermal dissipation unit 130 for dissipating heat. The heat dissipation via Vh is directly or indirectly connected with the thermal dissipation unit 130 to create a heat dissipation path, which is connected from the circuit board 100 to the external surface.

Figure 4F:
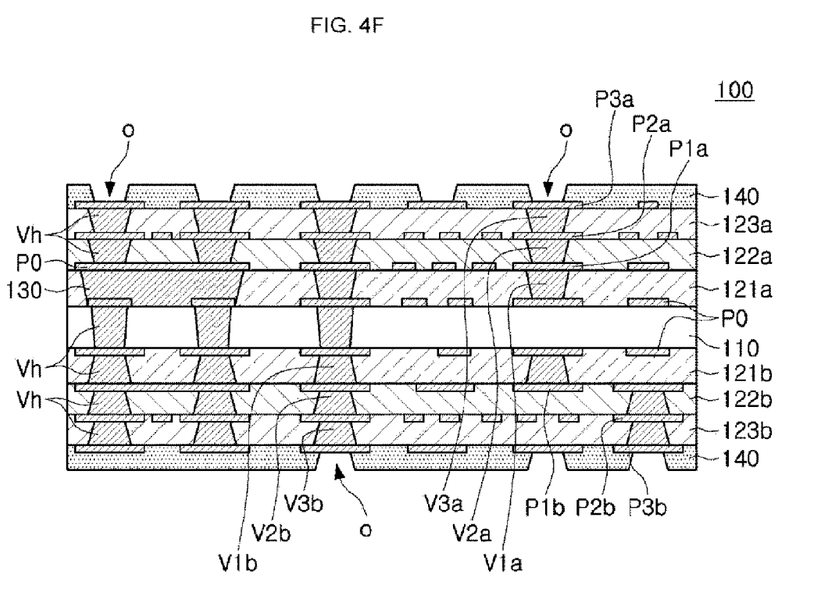

As shown in FIG. 4F, an outer layer 140 including a plurality of opening parts o are formed on the surface of the first build-up layer and the second build-up layer 122a, 122b. The opening part o of the outer layer provides a soldering area which is connected to an external circuit (e.g., electronic component) by exposing a part of the conductive patterns. The outer layer 140 may be formed of a solder resist material. For example, the outer layer 140 may be formed by compressing an unhardened (e.g., liquid) film for the solder resist on the surface of the first build-up layer 122a and the second build-up layer 122b and then hardening the result. The opening part o may be formed using an etching resist pattern. In a one example, the opening part o is formed by using a photosensitive insulating resin as the insulating resin for the solder resist, and then performing exposure and developing process.

Through the processes described above, the circuit board 100 including the thermal dissipation unit 130 may be formed and particularly, the thermal dissipation unit 130 easily formed through the filling process with the photosensitive insulating resin during the build-up process. The filling process of the conductive material described with FIG. 4D may be performed using the plating process. An example of the plating process is illustrated in FIG. 5A to FIG. 5D. FIG. 5A to FIG. 5D are enlarged views of the first build-up layer 121a in which thermal dissipation unit 130 is formed.

Figure 5A:
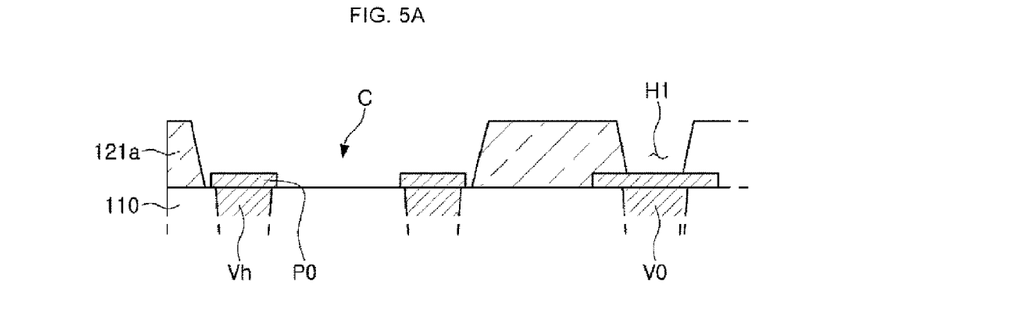
FIG. 5A to FIG. 5D are sectional views of each step illustrating an example of a method for manufacturing the circuit board illustrated in FIG. 4D.

Referring to FIGS. 5A to 5 D, a cavity C and a hole H1 may be formed by applying expose and developing process using a mask (see FIG. 4) in a photosensitive insulating layer 121a'. As shown in FIG. 5A, a first build-up layer 121a including the cavity C and the hole H1 may be formed by hardening the photosensitive insulating layer 121a'. If needed, a desmear treatment or plasma treatment may be performed to modify the inner surfaces of the cavity C and the hole H1.

Figure 5B:
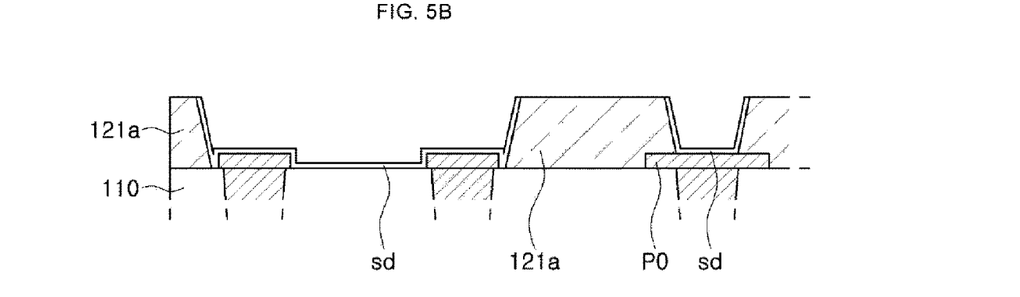

As shown in FIG. 5B, a metal seed layer sd is formed on the inner surfaces of the cavity C and the hole H1. The metal seed layer sd may include Cu, Au, Ni, Pd, In, Ti, Sn or any combination thereof.

Figure 5C:
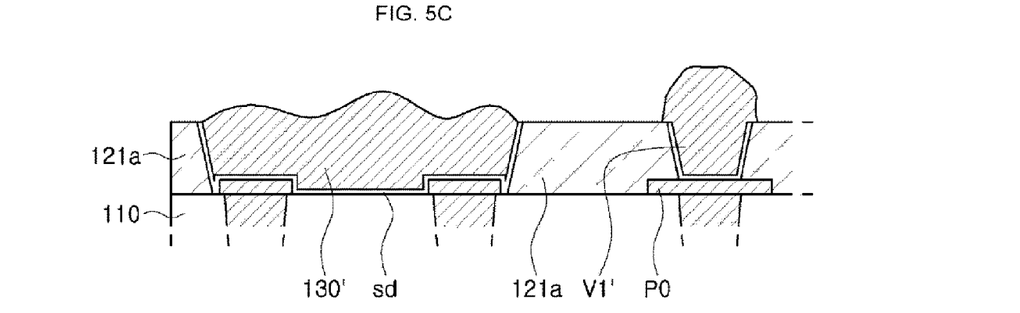

As shown in FIG. 5C, a plating layer 130', V1' is formed on the metal seed layer sd. The plating layer 130', V1' may be formed by filling the cavity C and the hole H1 using an electro plating process. The plating layer 130', V1' may include Cu, Au, Ag, Ni, Sn or any combination thereof. Since a volume of the cavity C is greater than that of the hole H1, when the same plating process is used to fill the cavity C and the hole H1, over-plating on the hole H1 may be caused in order to fill the cavity C.

Figure 5D:
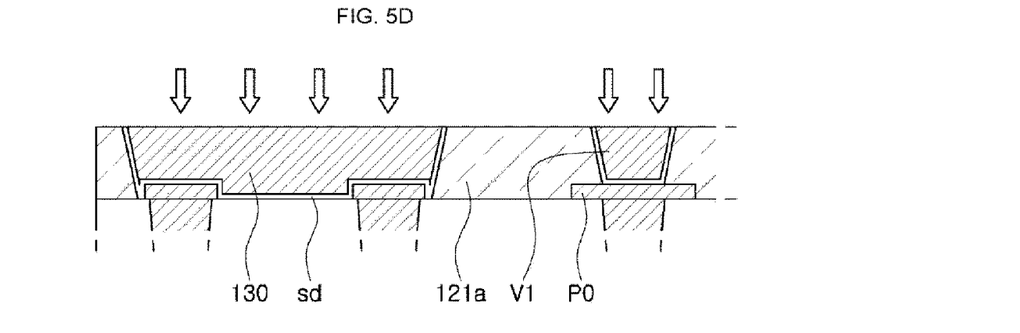

As shown in FIG. 5D, an over-plated part of the plating layer 130', V1' is removed and the surface thereof may be planarized, or smoothed. The thermal dissipation unit 130 and the conductive via V1a is thus formed to have the common surface with the surface of the first build-up layer 121a. The planarization process may be performed by an etch-down process using an etchant.

A desired circuit board 100 is formed by disposing additional build-up layers (see FIG. 4E) and forming an outer layer (see FIG. 4F).

Various arrangements of circuit boards may be formed. For example, several thermal dissipation units may be formed and be arranged in various shapes.

Figure 6:
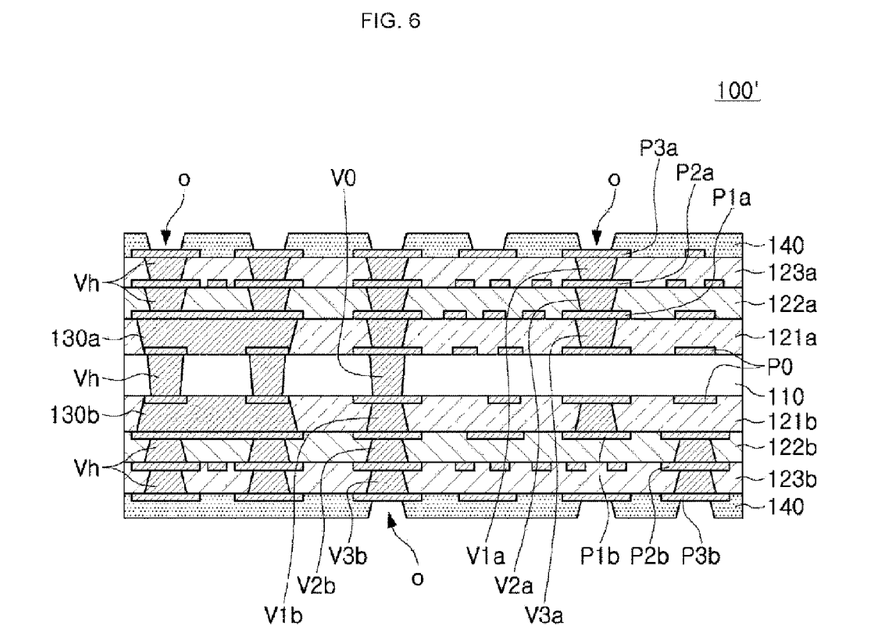
FIG. 6 to FIG. 8 are sectional views each illustrating an example of a circuit board, respectively.

Referring to FIG. 6, a circuit board 100' is similar to the circuit board 100 illustrated in FIG. 2. The circuit board 100' includes a core layer 110 and three first build-up layers 121a, 122a, 123a and three second build-up layers 121b, 122b, 123b formed on the upper surface and the lower surface of the core layer 110, respectively. However, unlike the previous example, the circuit board 100' includes first and second thermal dissipation units 130a, 130b at an overlapped area between the core layer and the first build-up layer 121a and the second build-up layer 121b which are adjacent to the core layer. The first and second thermal dissipation units 130a, 130b are arranged symmetrically based on the core layer 110. The first and the second thermal dissipation units 130a, 130b may be formed with the same number and size at the overlapped area.

The first build-up layer and the second build-up layer 121a, 121b may be formed of a photosensitive insulating resin by forming a cavity and a hole using the exposure and developing process and then filling the cavity and the hole with a plating process. The first and the second thermal dissipation units 130a, 130b have better thermal dissipation properties, compared to the circuit board illustrated in FIG. 2, since they are arranged continuously in the laminating direction.

Figure 7:
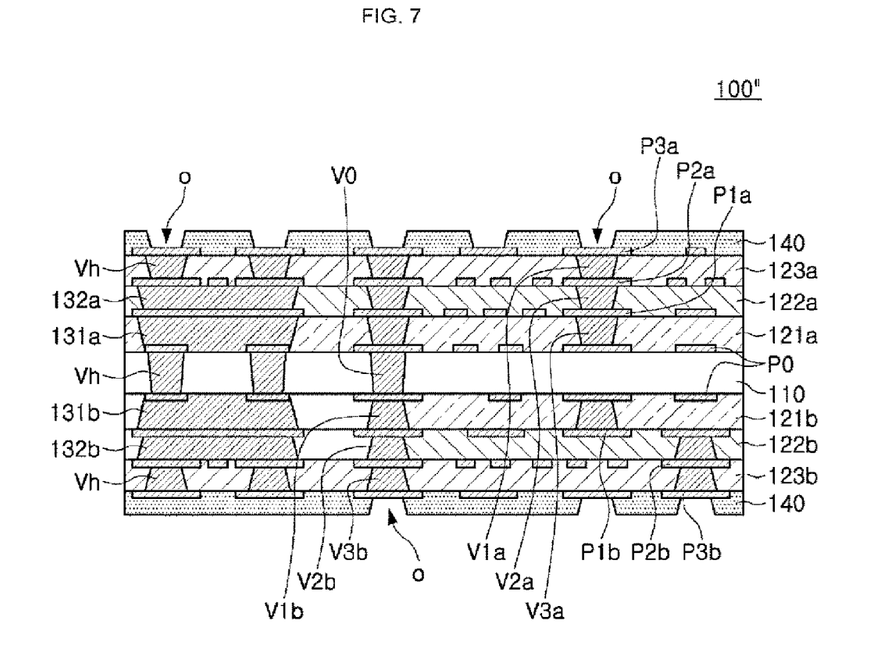

Referring to FIG. 7, a circuit board 100" according to an example includes 4 thermal dissipation units 131a, 132a, 131b, 132b at the overlapped areas. Thermal dissipation units 131a, 132a, 131b, 132b are formed on the first build-up layers 121a, 122a and the second build-up layers 121b, 122b, respectively. In this example, build up layers 123a and 123b do not have thermal dissipation units. Thermal dissipation units 131a, 132a, 131b, 132b may be also formed of a photosensitive insulating resin along with the conductive via having the same level during the build-up process.

Figure 8:
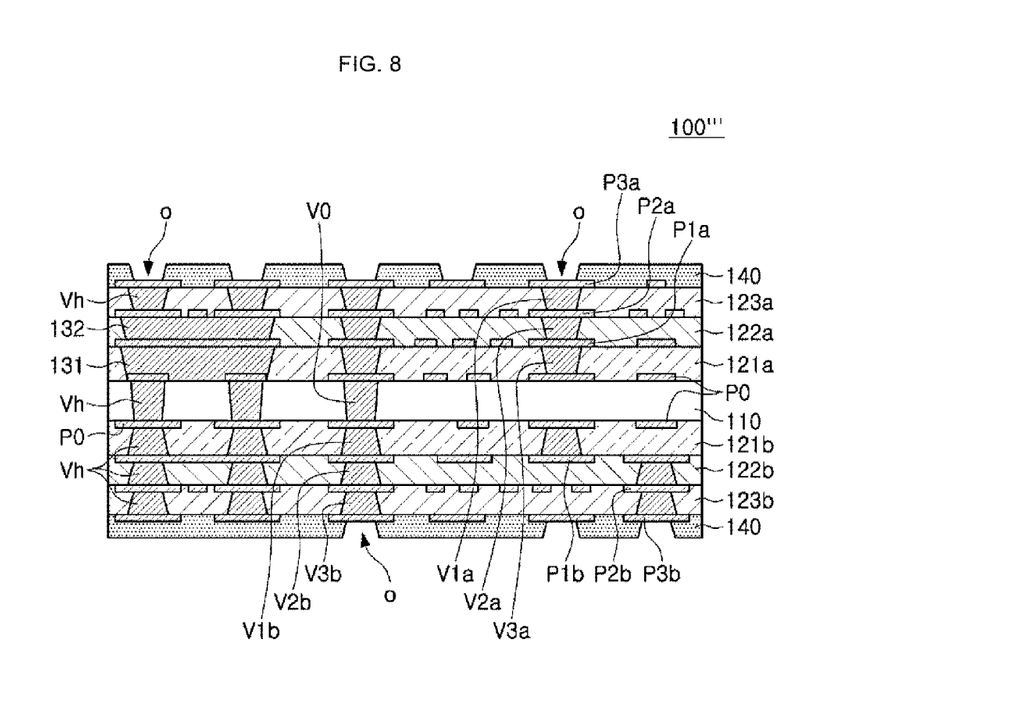

A circuit board 100''' illustrated in FIG. 8 includes two thermal dissipation units 131, 132. Thermal dissipation units 131, 132 are arranged asymmetrically unlike the circuit boards 100', 100" in FIG. 6 and FIG. 7. The thermal dissipation units 131, 132 are formed only on the first build-up layers 121a, 122a.

Such an asymmetric arrangement of the thermal dissipation units 131, 132 alleviates warpage of the board. Elements such as conductive vias, and conductive patterns having a different coefficient of thermal expansion are distributed non-uniformly based on a total area of the circuit board and such distribution causes serious warpage problems. For example, when conductive patterns and conductive vias are arranged relatively in one side based on a core layer, it may bend due to a conductive material having high coefficient of thermal expansion. Thus, it may be designed to have an asymmetric structure in order to alleviate the warpage problem by distributing a thermal dissipation unit in the area where a conductive material (e.g., Cu) having high coefficient of thermal expansion is distributed less.

For example when a ratio of volume occupied by the conductive pattern and the conductive via, excluding the thermal dissipation unit, to the entire volume of the first build-up layer and the second build-up layer is defined as a conductor volume fraction, the conductor volume fractions of each of the first build-up layer and the second build-up layer are different from each other. In this case, the thermal dissipation units included in the first build-up layer and the second build-up layer are asymmetrically arranged to reduce the difference of the conductor volume fractions. For example, the thermal dissipation unit are arranged only in one build-up layer (e.g. the first build-up layer or the second build-up layer) having a lower conductor volume fraction, or more number of thermal dissipation units and/or bigger thermal dissipation unit may be arranged. Even though the same number and the same size of the thermal dissipation unit is arranged, when it is arranged in a different level based on the core layer, it may reduce the warpage problem.

Figure 9:
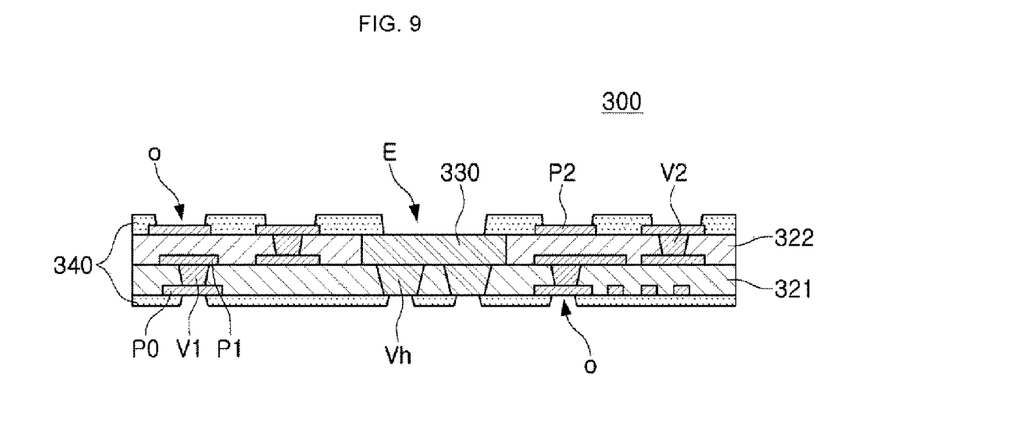
FIG. 9 is a sectional view illustrating an example of a coreless circuit board.

FIG. 9 is a sectional view illustrating an example of a circuit board (a coreless board).

Referring to FIG. 9, a circuit board 300 according to an example includes a first build-up layer and a second build-up layer 321, 322 which are laminated in order. In this example, a laminate of the build-up layers without a core layer is called as a "build-up laminator".

The first build-up layer 321 includes conductive patterns P0, P1 formed on the upper surface and the lower surface thereof and a conductive via V1 passing through the upper surface and the lower surface thereof. The second build-up layer 322 is formed on the first build-up layer 321 and includes a conductive pattern P2 and a conductive via V2.

The first build-up layer 321 and the second build-up layer 322 may be formed of a photosensitive insulating material. The conductive vias V1, V2 may be prepared by coating with the photosensitive insulating material, forming holes using selective exposure and developing process and then filling the holes with a conductive material (e.g. through plating). The second build-up layer 322 includes a cavity and a thermal dissipation unit 330 which is formed of a conductive material disposed in the cavity. The thermal dissipation unit 330 is formed by filling the inner space of the cavity C with a conductive material. The filling process may be performed by a plating process.

The thermal dissipation unit 330 is arranged in the area where an electronic component (not shown) generating heat is mounted. An outer layer 340 exposes a main area E of the upper surface of the thermal dissipation unit 330 to effectively release heat. The first build-up layer 321 includes a heat dissipation via Vh which is connected to the thermal dissipation unit 330. The heat dissipation via Vh is connected to the thermal dissipation unit 330 to provide a heat dissipation path which is extended to the lower surface of the circuit board 300.

In this example, the thermal dissipation unit 330 is formed only in one build-up layer 322. However, it may be formed in a different build-up layer. Furthermore, the board 300 may have three or more build-up layers.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit board comprising:
   a core layer comprising a first surface and a second surface opposite to the first surface;
   a first build-up layer and a second build-up layer formed on the first surface and the second surface of the core layer, respectively, and comprising a conductive pattern and a conductive via; and
   an outer layer formed on a surface of the first build-up layer or a surface of the second build-up layer,
   wherein at least one build-up layer of the first build-up layer and the second build-up layer comprises a photosensitive insulating layer in which a cavity is disposed and a thermal dissipation unit is disposed in the cavity,
   wherein the outer layer has a pad formed thereon, the pad being connected with an electronic component, and
   wherein the pad is connected with the thermal dissipation unit through a heat dissipation via.

2. The circuit board of claim 1, wherein a conductive material of the thermal dissipation unit is the same as a conductive material of a conductive via formed in the photosensitive insulating layer.

3. The circuit board of claim of claim 2, wherein the conductive material comprises a metal seed layer formed on an inner surface of the cavity and a plating layer formed on the metal seed layer.

4. The circuit board of claim 1, wherein the first build-up layer and the second build-up layer each comprises a plurality of build-up layers.

5. The circuit board of claim 4, wherein the plurality of build-up layers of the first build-up layer, and the plurality of build-up layers of the second build-up layer and the core layer together comprises the heat dissipation via directly or indirectly connected to the thermal dissipation unit.

6. The circuit board of claim 4, wherein at least one build-up layer among the first build-up layer and the second build-up layer comprises two or more build-up layers which are adjacent to each other and thermal dissipation units are formed in the two or more build-up layers which are adjacent to each other and are laminated to be overlapped in a laminated direction of the build-up layers.

7. The circuit board of claim 4, wherein each of the first build-up layer and the second build-up layer comprises at least one build-up layer in which the thermal dissipation unit is formed.

8. The circuit board of claim 7, wherein thermal dissipation units formed in the at least one build-up layer in each of the first build-up layer and the second buildup layer are laminated to be overlapped in a laminated direction of the build-up layer.

9. The circuit board of claim 7, wherein the at least one build-up layer in each of the first build-up layer and the second build-up layer is formed in a different number of layers.

10. The circuit board of claim 1 wherein the thermal dissipation unit comprises a plurality of thermal dissipation units arranged asymmetrically with respect to the core layer.

11. The circuit board of claim 1, wherein a conductor volume fraction of each of the first build-up layer and the second build-up layer are different from each other,
- wherein the conductor volume fraction comprises a ratio of volume occupied by the conductive pattern and the conductive via, excluding the thermal dissipation unit, to the entire volume of the first build-up layer and the second build-up layer, and
- wherein the thermal dissipation unit is arranged asymmetrically with respect to the core layer to reduce the difference of the conductor volume fractions of the first build-up layer and the second build-up layer.

\* \* \* \* \*